United States Patent [19]

Goldberg

[11] Patent Number: 5,075,039
[45] Date of Patent: Dec. 24, 1991

[54] PLATABLE LIQUID FILM FORMING COATING COMPOSITION CONTAINING CONDUCTIVE METAL SULFIDE COATED INERT INORGANIC PARTICLES

[75] Inventor: Robert L. Goldberg, Sharon, Mass.

[73] Assignee: Shipley Company Inc., Newton, Mass.

[21] Appl. No.: 531,354

[22] Filed: May 31, 1990

[51] Int. Cl.$^5$ .............................................. H01B 1/20
[52] U.S. Cl. ................................ 252/518; 252/511; 252/519; 252/520; 506/1.23; 506/1.22; 524/420; 523/457; 427/305; 205/118; 205/163
[58] Field of Search ............... 252/511, 518, 519, 520; 106/1.23, 1.22; 524/420; 523/457, 458, 459; 204/14.1; 427/304, 305

[56] References Cited

U.S. PATENT DOCUMENTS

| | | |
|---|---|---|
| 3,011,920 | 12/1961 | Shipley . |
| 3,445,350 | 5/1969 | Klinger et al. . |
| 3,471,313 | 10/1969 | Soubestne et al. . |
| 3,560,257 | 2/1971 | Schneble et al. . |
| 3,617,363 | 11/1971 | Metzger .............................. 106/1.23 |
| 3,661,597 | 5/1972 | Green . |
| 3,728,137 | 4/1973 | Shipley et al. . |
| 3,754,070 | 8/1973 | Gunn et al. . |
| 3,765,936 | 10/1973 | Shipley et al. . |
| 3,940,533 | 2/1976 | Arsac .................................. 427/125 |
| 3,958,066 | 5/1976 | Imamura et al. .................... 428/372 |
| 4,113,658 | 9/1978 | Geus . |
| 4,126,582 | 11/1978 | Giem et al. . |
| 4,253,875 | 3/1981 | Heymann et al. . |
| 4,511,494 | 4/1985 | Frommer et al. ................... 252/518 |
| 4,514,486 | 4/1985 | Shinose et al. . |
| 4,556,507 | 12/1985 | Tomibe et al. ..................... 252/518 |
| 4,639,380 | 1/1987 | Amelis et al. . |
| 4,696,764 | 9/1987 | Yamazaki . |
| 4,752,415 | 6/1988 | Iwaskow et al. .................... 252/511 |
| 4,775,557 | 10/1988 | Bastenbeck et al. . |
| 4,783,243 | 11/1988 | Ando et al. ........................... 204/15 |
| 4,820,553 | 4/1989 | Sopchak et al. . |
| 4,863,758 | 9/1989 | Rhodinizer . |
| 4,868,008 | 9/1989 | Marikar et al. .................... 427/126.1 |
| 4,895,739 | 1/1990 | Bladon ................................. 427/304 |
| 4,981,725 | 1/1991 | Nuzzi et al. . |

FOREIGN PATENT DOCUMENTS

676894 12/1963 Canada .
512204 4/1976 U.S.S.R. .

*Primary Examiner*—Paul Lieberman
*Assistant Examiner*—Bradley A. Swope
*Attorney, Agent, or Firm*—Robert L. Goldberg

[57] ABSTRACT

The invention discloses a new platable coating composition and a process of using the same for selective plating. The coating composition and process are especially adapted for formation of EMI shielding for electronic components. The coating composition comprises particulates dispersed in a liquid film forming composition which particulates are coated with a conductive metal chalcogenide.

21 Claims, No Drawings

PLATABLE LIQUID FILM FORMING COATING COMPOSITION CONTAINING CONDUCTIVE METAL SULFIDE COATED INERT INORGANIC PARTICLES

BACKGROUND OF THE INVENTION

1. Introduction

This invention relates to a process and materials for electrolytic metal deposition. More particularly, this invention relates to a novel platable coating composition comprising a particulate having an adsorbed coating of a metal chalcogenide uniformly dispersed in a liquid coating composition. Following coating and drying of the coating composition on a substrate, protruding particles with exposed metal chalcogenide are sufficiently conductive to enable electrolytic metal deposition over the coating. The platable coating composition and process are especially suitable for plating segregated areas such as single sided metal deposition in applications such as the formation of electromagnetic interference (EMI) and radio frequency interference (RFI) shieldings for housings for electronic equipment.

2. Discussion of Prior Art

Electromagnetic interference emissions are undesirable energy emissions within a frequency range of from less than 60 Hz to more than 1,000 MHz. Radio frequency interference (RFI) is the portion of EMI radiation in about the 0.01 to 1,000 MHz range.

EMI radiation is created by operation of many diverse forms of electronic equipment ranging from microwave equipment to home computers. The radiation occurs because electronic devices emit "noise" in the above frequency range that is picked up by other devices or by conduction through power lines that act as antennas. EMI radiation may interfere with other devices and has been known to cause such diverse problems as interference with police mobile radios, communication systems, scientific test equipment and cardiac pacemakers.

In recent years, the use of electronic equipment in the home and work place has grown rapidly with a concomitant increase in sources of EMI emissions. Additionally, most housings for electronic equipment are now fabricated from plastic rather than metal Plastics are lighter, more versatile, easier to fabricate and less expensive than metal but do not possess the intrinsic EMI/RFI shielding capabilities provided by metal enclosures.

The Federal Communications Commission has published a series of regulations concerning standards for maximum allowable EMI emissions for electronic devices. The regulations, which became effective in October 1983, apply to all digital electronic products that use or generate frequencies between 10 KHz and 1,000 MHz. These regulations therefore include commercial, industrial, business, and home products such as computers, calculators, cash registers, electronic typewriters, video equipment, and electronic games. The regulations require that the electronics industry develop electronic devices which have electromagnetic compatibility (EMC); in other words, equipment which neither interferes with other devices nor is itself susceptible to interference.

One approach to limiting electromagnetic containment is the use of an EMI shield to contain the radiation. Containment requires special shielding materials, components, and structures which prevent generated energy from escaping and acting as a source of disturbance.

The effectiveness of electromagnetic containment is determined by the degree to which the field strength is attenuated as a result of reflection or absorption by the shielding material. Shielding efficiency is calculated as a logarithmic function of the ratio of unshielded EMI transmission to shielded EMI transmission and is expressed in decibels. Because of the logarithmic nature, an increase of 30 db in shielding efficiency for a given wavelength or frequency of electromagnetic radiation represents a 1,000 percent increase in the shielding efficiency of the coating A coating with a shielding efficiency of 30 db, for example, eliminates 99.9% of the total EMI radiation. A 60 db coating eliminates 99.9999% of the total EMI radiation.

There are several shielding methods in commercial use for non conductive materials. The method most often used involves a metallic coating applied over a plastic housing for the electronic device. An early publication showing the use of multiple metal coatings over a plastic housing is Engineering, 9, Dec., 1966, pp. 1026 and 1027. Methods for applying metallic coatings disclosed in this reference include galvanic deposition, spray coating, chemical metallizing and vacuum metallizing. Metal coatings include copper, silver, chromium, nickel, silver, gold, zinc, etc.

Metals are applied over housings for electronic equipment in a number of ways. For example, EMI shielding materials have been arc-sprayed (zinc) and painted with metal-containing paints (nickel) onto the electronic housings. Both of these methods have serious disadvantages. Arc-sprayed zinc is an effective EMI shield with attenuation to 120 db or more. However, zinc is toxic and expensive, the procedure is labor intensive, and the coating is prone to cracking and peeling. Conductive nickel paints are easier to apply than arc-sprayed coatings, but do not cover recessed areas, provide attenuation to only 20 to 60 db and often require multiple coatings Silver and copper conductive paints have also been used in the manufacture of EMI shielding. Silver is a good conductor, but is expensive and oxidizes. Copper conductive paints are easy to apply, economical, used with conventional equipment, are wear resistant and have good resistance to flaking. However, copper tends to oxidize which results in a loss of conductivity and a concomitant loss of shielding effectiveness.

Other methods for applying metallic coating include cathode sputtering and vacuum metallizing. Such coatings show good conductivity and good adhesion, but require expensive equipment for application, are prone to microscopic cracking, can distort thermoplastics, require high power, are batch operations and are limited by part configuration.

Recently, interest has been generated in the use of electroless metals for EMI shielding. Electroless plating of surfaces for EMI shielding is shown in the prior art as early as 967. Lordi, *Plating*, Vol. 54, p. 382, (1967), incorporated herein by reference, discusses the use of both electroless copper and electroless nickel as shielding materials. Lordi discusses electronic applications for electroless copper and electroless nickel specifically noting EMI shielding, teaches that electroless nickel can be used as an intermediate coating over copper to prevent corrosion and finally, that electroless copper can be protected by a coating of a second metal to prevent oxidation.

Recently, a number of publications have discussed the use of electroless metals for EMI applications. *Plastics Technology*, Vol 27, June '81 p. 67, teaches the use of electroless metals as EMI shielding materials. *Plastics World*, Vol. 40, pp. 40–45, September 1982 states that electroless plating may be less expensive than many of the shielding processes now in use and can give comparable shielding performances. The economy of application of electroless plating for EMI shielding is demonstrated in a 1982 article in *Industrial Finishing*, Vol. 58, pp 100 to 101. Smoluk, *Modern Plastics*, September '82, pp. 48–51 cites several commercially available electroless plating systems for shielding applications. Smoluk reports electroless copper coatings with demonstrated SE values of 80 to 116 db, and electroless nickel coatings with SE values exceeding 45 db.

As discussed in the literature, both electroless copper and electroless nickel have been used in the electroless plating of plastic substrates. Both have advantages and disadvantages. Copper, with a relative conductivity of 1.0 (second only to silver with a conductivity of 1.05), has high shielding effectiveness. An additional advantage of copper is a relatively low cost. Disadvantages of copper are relatively low abrasion (wear) resistance and a relatively poor corrosion resistance with a strong tendency to oxidize which significantly reduces the shielding effectiveness Electroless nickel serves as a good paint base, has high wear resistance, stable electrical contact resistance, good solderability, and good corrosion resistance. *Plastic Design Forum*, November/December 1982, pp. 17–26, states that while electroless nickel is less conductive than electroless copper and therefore less effective as a shielding material, it possesses better corrosion resistance and may be preferable to electroless copper for EMI shielding applications, especially in severe environmental conditions. The major disadvantage to use of electroless nickel is its low relative conductivity of 0.20 or less. However, electroless nickel is relatively expensive and therefore, high cost is a disadvantage to the use of electroless nickel as a shielding material.

Disadvantages attendant to the use of electroless copper and electroless nickel separately as shielding materials are partly overcome by a dual layer of electroless copper overplated with electroless nickel. Such a dual layer is believed to be first suggested by Lordi (supra) in 1967. In 1983, Krulik, in *Industrial Finishing*, May, 1983, pp. 16–18, states that "the (electroless) copper's disadvantages are overcome by coating the copper layer with a thin layer of electroless nickel. The electroless nickel is deposited to protect the copper. The nickel's relative high cost is minimized by the thinness of the layer." A 1983 article by Hadju and Krulik in *Plating and Surface Finishing*, July, 1983, pp. 42–44, states that "a composite coating of electroless copper with a top layer of electroless nickel will combine the desirable characteristics of both. There is no degradation of the excellent shielding properties of electroless copper which can be adjusted in its shielding efficiency by varying its thickness. A relatively thin coating of electroless nickel provides corrosion resistance, paint adhesion, stable low electrical contact resistance, and other desirable properties and may be maintained at a constant thickness". A dual layer of electroless copper coated with electroless nickel is also disclosed in U.S. Pat. No. 4,514,486 incorporated herein by reference. This configuration utilizes the high conductivity of the electroless copper for EMI attenuation and the corrosion resistance of the electroless nickel to protect the copper against oxidation.

Briefly, electroless plating of plastics comprises immersing a part in a series of aqueous baths which both prepare the surface of the part for deposition and permit metallization. Following conventional pretreatment steps, a part to be plated is then immersed into a catalyst solution containing noble metals to render non conductive surfaces catalytic to deposition of the desired plating metal. An example of a noble metal catalyst is disclosed in U.S. Pat. No. 3,011,920 incorporated herein by reference. The patent teaches treatment of the dielectric substrate with a colloidal palladium solution to render it, catalytic to deposition of the dissolved metal.

Following catalysis, the part is then immersed into an electroless plating solution containing dissolved metals which, in contact with the plating catalyst, results in deposition of a coating of the metal onto the catalyzed surface.

Known procedures for electroless deposition of metal for EMI shielding are acknowledged by the art to provide superior coatings. However, one problem associated with their use is that the coating process is not selective. Coating is by immersion of the entire part to be plated into a liquid treatment solution—i.e., a colloidal catalyst solution followed by a metal plating solution. The result is that metal is plated over the entire surface of the nonconductor. Where aesthetics are important in the marketing of electronic components, a metal coated housing for the component is undesirable and typically, the industry paints the metal coating. This is a time consuming and wasteful step, especially where housings are most often molded in a desired color. For this reason, it would be desirable to have a selective process for plating only the interior of the housing without plating the exterior of the housing.

An attempt at selective plating of housings for EMI protection is disclosed in U.S. Pat. No. 4,670,306 incorporated herein by reference. In this patent, a process is taught comprising applying an adsorptive coating onto selected portions of an electronic housing where plating is desired. Selectivity is achieved by a masking procedure. This creates areas on the housing of differential adsorptivity. Thereafter, the housing is immersed in a catalyst solution and more catalyst is absorbed onto the absorptive coating than onto the balance of the housing thereby permitting selective metal deposition. In commercial practice, however, it has been found that selectivity is not adequate because of the required close control of all plating variables to obtain selectivity.

In published U.K. Patent Application Serial No. 2, 169 925 A, incorporated herein by reference, another process for selective plating for EMI shielding applications is disclosed. In this process, a lacquer is used having suspended particles of metal which may be in the form of flakes, fibers, particulates and in one embodiment, commercially available silver coated glass spheres The part to be plated is masked where plating is undesired, spray coated with the lacquer where plating is desired, the mask is removed and the part electrolessly metal plated selectively in a pattern conforming to the lacquer coating. The process of U.K. Application Serial No. 2 169 925 A is an improvement over that of above referenced U.S. Pat. No. 4,620,306 in that better selectivity is obtainable with fewer processing steps.

However, a problem encountered with the process is the need to expose and treat metallic (catalytic) particles embedded in and sealed by the lacquer coating during coating and drying to form initiation sites for metallization. The steps of exposing and/or treating the particles prior to plating are costly and time consuming. Additional problems are encountered due to the high levels of metal loading in the lacquer which are normally in the order of 50% w/w. A high loading of metal is costly and the coating formed using this lacquer is rough in appearance as a consequence of the high solids content of the lacquer. Moreover, and possibly due to the rough surface, the metallic particles are poorly adhered to the substrate, flake off during processing and can fall into circuitry causing equipment problems and failures.

In copending U.S. patent application Ser. No. 07/531,156 filed concurrently herewith and assigned to the same assignee as the subject invention, a new plating catalyst is disclosed that is an improvement over the plating catalyst and process disclosed in the aforesaid U.K. Patent Application No. 2,169,925A. The electroless plating catalyst claimed in the copending application comprises a mixture of several different catalytic particles dispersed in a liquid coating composition. Each of the catalytic particles comprises a reduced noble metal salt deposited onto inert carrier particles such as colloidal carbon or silica. One portion of the catalytic particles comprises a reduced platinum family metal over a particulate carrier and the other reduced silver over a particulate carrier. Preferably, the carrier particles are irregularly shaped and possess jagged edges and most preferably comprise colloidal silica. The liquid coating composition used to carry the catalytic particles is a resin in a solvent such as a paint or varnish base and may be organic or aqueous, but is preferably an organic lacquer made using a solvent that softens the top surface of the substrate over which metal is to be plated.

In copending U.S. patent application Ser. No. 531,440 filed concurrently herewith and assigned to the same assignee as the subject invention, another new plating catalyst is disclosed that is based upon the discovery that a hydrous oxide of a metal catalytic to electroless deposition may be used as an adsorbed catalytic precursor over a suspended particulate in a coating composition. Following application of the coating composition on a substrate and drying of the same, the particulates protrude through the surface of the coating thereby exposing the hydrous oxide. Upon contact of the exposed hydrous oxide to a solution containing a reducing agent, such as an electroless metal deposition solution, the reducing agent reduces the hydrous oxide to a reduced form that is catalytic to electroless metal deposition thereby enabling metal to deposit over the substrate. Hence, the plating catalyst disclosed in said application is similar to that of copending application Ser. No. 531,156 in that it comprises suspended particulates in a liquid coating composition where the suspended particles have an adsorbed species usable in an electroless metal deposition process, but the adsorbed species is not reduced prior to contact with a plating solution

SUMMARY OF THE INVENTION

The platable coating composition of this invention is an alternative to the plating catalyst of copending U.S. patent applications Ser. Nos. 531,156 and 531,400 in that it has now been found that particles dispersed within a coating composition may have a metal chalcogenide on their surface which chalcogenide is sufficiently conductive to permit electrolytic metal deposition without the requirement for an intermediate step of electroless metal deposition. This is a distinct advantage over prior processes requiring an electroless metal layer as a conductive layer for subsequent electrolytic deposition as electrolytic metal deposition is lower in cost than electroless metal deposition and the plating solutions used in electrolytic deposition are more stable and do not require the extensive waste treatment procedures required of electroless metal deposition solutions The platable coating compositions of this invention comprise particles dispersed in a liquid coating composition where the particles have a conductive metal chalcogenide adsorbed on their surface. The metal chalcogenide is one that is adequately conductive for direct electrolytic deposition. Copper, nickel and noble metal chalcogenides are preferred. The carrier particles onto which the metal chalcogenide is adsorbed are preferably irregularly shaped and possess jagged edges and most preferably comprise colloidal silica. The platable coating composition in which the particles are dispersed to form the plating catalyst is a resin in a solvent such as a paint or varnish base and may be organic or aqueous, but is preferably an organic lacquer made using a solvent that softens the top surface of the nonconductor over which metal is to be plated.

The plating process of the invention is characterized by fewer processing steps and is an improvement over the process of U.K. Patent Application No. 2,169,925A in that it does not require a step of exposing and/or treating catalytic metal particles prior to electroless metal plating as is required in said U.K. Patent Application and because plating takes place by electrolytic deposition rather than by electroless deposition. The process of the invention permits plating at a good plating rate and results in a deposit that is and remains strongly adhered to its underlying substrate during prolonged use. The invention is especially useful for formation of selectively deposited metal coatings and is especially suitable for the formation of EMI coatings on housings for electronic components.

Using a preferred platable coating composition for purposes of illustration, upon application of the coating composition on a plastic substrate, the solvent from the coating composition solvates and softens the plastic. This results in bonding the polymer phase of the coating composition to the plastic substrate over which the catalyst is coated, which in turn bonds the particles within the coating composition to the substrate. For reasons to be more fully explained below, the particles protrude from the surface of the coating thus exposing the conductive metal chalcogenide to subsequently applied plating solutions. Upon contact with an electrolytic metal plating solution, metal is readily deposited over the coating without the requirement for treatment to expose the particles as required in the prior art. Additionally, the particles are firmly adhered to the substrate and do not flake off during prolonged use of the article. The metal coating formed over the particles is relatively smooth compared to coatings obtained using the catalyst of the aforesaid U.K. Patent Application.

The platable coating composition of the invention is adaptable for plating of a contiguous but segregated portion of a surface. When selectively applied to a contiguous surface, such as the interior portion of an electronic housing, using conventional masking and spraying procedures as more fully explained below, metallization over the substrate will be

DESCRIPTION OF THE PREFERRED EMBODIMENTS

As aforesaid, the platable coating composition of the invention comprises particles dispersed in a liquid coating composition where the particles have a metal chalcogenide adsorbed on their surface or are of a composition readily converted to a chalcogenide which chalcogenide is sufficiently conductive to enable direct electrolytic metal deposition from an electrolytic plating solution. The platable coating composition comprises one or more film forming resins and other additives dissolved in a solvent.

In accordance with the invention, inert carrier particles over which the metal chalcogenide is adsorbed include known inorganic colloidally dispersed particles such as carbon; various types of silicas including synthetic calcined silicas (produced by heating with a flame), synthetic precipitated silicas (produced by chemical reaction), silicas of fossil origin (diatomaceous), detritic natural silicas (powdered or micronized sand); alumina; pigments such as titanium dioxide; etc. Silica is a preferred carrier. Most preferred is an organically coated silica where the organic coating aids in the prevention of settling of the silica from the coating composition during storage. An example of a preferred silica is ED-30 available from W.R. Grace Ltd.

The particle size of the inert carrier particles may range within wide limits, but preferably ranges between about 0.1 and 500 microns, more preferably between about 1 and 250 microns and most preferably between about 1 and 50 microns. The surface areas of such particles typically range between 100 and 900 $m^2/gm$.

In a preferred embodiment of the invention, the inert carrier particles are irregularly shaped rather than smooth such as glass beads. Irregularly shaped particles have jagged edges which penetrate a dried coating following application and drying of the plating catalyst on a substrate. This facilitates initiation of the plating reaction without a need to treat the dried coating to expose the catalytic material Various liquid coating compositions containing film forming resins may be used as the carrier for the catalytic particles of the invention Useful aqueous based coating compositions include solutions of polymers such as acrylic homopolymers or copolymers; polyurethanes; polyamides; polyesters; alkyd resins; ethylene copolymers with acrylates or vinyl acetate; chlorinated or unchlorinated homopolymers or copolymers of vinyl chloride; vinyl acetate or vinyl proprionate; cyclisized or chlorinated rubber; nitrocellulose; ethyl or ethylhydroxy cellulose; coumarine-indene resins; terpene resins; polyvinyl acetal resins; cellulose esters such as cellulose acetobutyrate and cellulose acetoproprionate; shellac; and other natural resins singularly or in combination.

Organic solvent based liquid coating compositions containing film forming resins include solutions of phenolics; epoxies; polyesters; acrylics; hydroxylated copolymers of vinyl chloride and vinyl acetate; amine or amide resins such as polyamides; urea formaldehyde; melamine formaldehyde resins; hexamethoxymethyl melamine; benzoguanamine-formaldehyde resins; isocyanates; etc.

In general, the particles dispersed in the platable coating composition are prepared by one of several alternative procedures. For example, a conductive metal chalcogenide may be formed as a colloid and adsorbed onto the particulate. Alternatively, a hydrous oxide may be adsorbed onto the carrier particles followed by contact of the hydrous oxide with a chalcogen to form the chalocgenide. Metals suitable for formation of the metal chalcogenide are those known to be sufficiently conductive for direct electrolytic metal deposition and include, for example, copper, nickel, manganese, cobalt, iron and the noble metals such as silver, gold, platinum, palladium, indium, rhenium, rhodium. The preferred metals are silver and nickel, nickel being more preferred.

In the embodiment of the invention where the chalcogenide is formed from a hydrous oxide, the first step in the process involves adsorption of the hydrous oxide on the surface of the carrier particles. Hydrous oxides may be formed from many metals, including those contemplated herein. Examples of the formation of hydrous oxides are disclosed in U.S. Pat. No. 3,657,003 granted Apr. 18, 1972 and in *Inorganic Colloid Chemistry* by H. B. Weiser, Vol II, "The Hydrous Oxides and Hydroxides," Chapter I, John Wiley and Sons, Inc., New York (1935), both incorporated herein by reference The meaning of the term hydrous oxide as used herein is in accordance with the definition in the above cited patent.

Metal hydrous oxides are formed by preparing an aqueous solution of a salt of the desired metal with agitation, pH adjustment and heat as necessary to obtain complete dissolution of the salt in solution Thereafter, a hydrolysis and nucleation reaction is permitted or caused to take place at a controlled rate within the solution. This reaction takes place until a hydrous oxide is formed in situ. The hydrolysis reaction is permitted to continue until the solubility limit of the solution is exceeded to form a separate, dispersed colloidal phase. Details of the hydrolysis reaction can be found in the above cited references and do not constitute a part of this invention though the use of the hydrous oxide colloids to form a plating catalyst is considered inventive.

Examples of formation of hydrous oxides suitable for use in the subject invention follow.

EXAMPLE 1

Formation of a hydrous oxide of palladium—A 1 percent by weight solution of palladium chloride may be dissolved in 100 milliliters of water. The mixture may then be stirred until the maximum amount of palladium chloride is dissolved. The pH of the solution at this point would be about 2.7 but would decrease slowly with formation of a murky brown hydrous oxide colloid of palladium.

EXAMPLE 2

Formation of hydrous oxide of palladium—alternative method 10 ml of a 5 percent by weight stock solution of palladium chloride may be added to 100 ml of water. The initial pH of the solution would then be raised with dilute sodium hydroxide to a pH of about 3.0 to form a brown hydrous oxide colloid.

EXAMPLE 3

Formation of a hydrous oxide of platinum—A 1 percent by weight solution of platinous dichloride may be formed by dissolving the salt in 100 ml of hot (70° C.) dilute hydrochloric acid. After cooling to room temperature, the pH of the solution may then be raised to 3 with sodium hydroxide to form a yellow hydrous oxide colloid of platinum.

EXAMPLE 4

Formation of a hydrous oxide of copper—A 1 percent by weight solution of cupric chloride may be formed by dissolving the cupric chloride in 100 milliliters of water. The solution may then be heated to about 70° C. while the pH would be continuously adjusted as necessary to about 6 with sodium hydroxide. After about 60 minutes of heating, a deep blue hydrous oxide of copper would be formed.

EXAMPLE 5

Formation of a hydrous oxide of silver—A 0.25 percent by weight solution of silver nitrate may be formed by dissolving the salt in 100 ml of water with the pH raised rapidly to about 7 with sodium hydroxide. The pH would then b slowly raised with sodium hydroxide to a range of from 8 to 9 to form a milky white hydrous oxide of silver.

EXAMPLE 6

Formation of a hydrous oxide of gold—A 1 percent by weight solution of auric chloride would be dissolved in 100 ml of water to produce a yellow solution. The pH would then be slowly raised over a period of 2 days to about 4 to 5 with sodium hydroxide. During the raising of the pH, the solution would be continuously stirred and slightly heated to about 40° C. to form a brown hydrous oxide of gold colloid.

EXAMPLE 7

Formation of a hydrous oxide of nickel—a 1 percent by weight solution of nickel chloride hexahydrate would be dissolved in 100 ml of water and sodium hydroxide added in sufficient quantity to effect a Tyndal cone. The solution would be heated to about 60° C. for 2 days keeping the pH adjusted to about 4.0 to form a green hydrous oxide.

EXAMPLE 8

Formation of a hydrous oxide of iron—a 1 percent by weight solution of ferric chloride hexahydrate would be dissolved in 100 ml of water while heating the solution to about 70° C. with stirring. The pH would be adjusted to about 1.8 to form a tan hydrous oxide.

EXAMPLE 9

Formation of a hydrous oxide of manganese—a 1 percent by weight solution of manganese trichloride would be dissolved in 100 ml of hydrochloric acid solution to form a solution having a pH of about 1.0. Hydrogen peroxide would then be added. The solution would be heated and the pH maintained with sodium hydroxide to form a brown hydrous oxide.

EXAMPLE 10

Formation of a hydrous oxide of cobalt—a 1 percent by weight solution of cobaltous chloride hexahydrate would be dissolved in 100 ml of water to form a solution having a pH of about 5.0. The pH would then be increased with sodium hydroxide to about 7.0 to form a blue hydrous oxide.

The hydrous oxide, as formed above, may be formed in the presence of a dispersed particulate carrier to cause adsorption of the hydrous oxide colloid onto the particulate carrier as the hydrous oxide is formed. Alternatively, the hydrous oxide may be formed and the particulate carrier added to the colloidal solution of the hydrous oxide to adsorb the hydrous oxide onto the carrier.

Following adsorption of the hydrous oxide on the particulate carrier, the hydrous oxide may be converted to a chalcogenide or may be converted to the chalcogenide after coating the coating composition onto a substrate and drying the same. Whether conversion to the chalcogenide occurs prior to or subsequent to coating, the conversion to the chalcogenide is accomplished by treating the carrier particles having the adsorbed hydrous oxide with a chalcogenide salt that permits a replacement reaction to occur. Alkali metal and alkaline earth metal sulfides as taught in U.S. Pat. No. 3,658,661 incorporated herein by reference, are preferred. Alkali metal sulfides are most preferred and include the alkali metal monosulfides, the alkali metal polysulfides, the alkali metal sulfhydrates and aqeuous solutions of sulfur in alkali metal hydroxides. The preferred alkali metals are sodium, potassium, lithium and cesium. Alternatively, hydrogen sulfide gas may be bubbled through the solution containing the carrier particles. Contact of the chalcogen with the hydrous oxide will result in a reaction that converts the hydrous oxide to the chalcogenide, preferably the sulfide.

In an alternative embodiment of the invention, a chalcogenide colloid ma be formed that is adsorbed onto the carrier particle. Methods for formation of colloids of chalcogenides are known in the art. The formation of colloids of metal sulfides is shown by Schlessinger, *Inorganic Laboratory Preparations*, Chapter 7, 1962 and by Zsigmondy, *The Chemistry of Colloids*, Chapter 3, pp 176 to 178, John Wiley and Sons, New York, 1917, both incorporated herein by reference. Typically, the procedure involves treatment of dilute solutions of the corresponding metal salt with hydrogen sulfide to form the sulfide. As with the formation of hydrous oxides, the colloid of the chalcogenide may be formed in the presence of the particulate carrier to thereby adsorb the colloid directly onto the carrier.

In a further embodiment to the invention, the particulate having the adsorbed hydrous oxide may be dispersed in the coating composition and following coating of a substrate with the coating composition and drying of the same, the exposed particles coated with the hydrous oxide may be treated with a solution of the chalcogenide to convert the hydrous oxide protruding from the coating to the chalcogenide.

If the platable coating composition of the invention is to be an aqueous based composition, the particulate carrier having the adsorbed chalcogenide or hydrous oxide on its surface may then be dispersed in the coating composition. If the plating catalyst is to be an organic coating composition, the particulate carrier having the adsorbed chalcogenide or hydrous oxide on its surface may be recovered by filtration, washed and then dispersed in the coating composition. Dispersion of the particles in the coating composition may be assisted by stirring or preferably ultrasonic agitation to break colloidal agglomerates as is known in the art.

In that embodiment of the invention where the particulate carrier coated with the chalcogenide or hydrous oxide is dispersed in an organic medium, following washing, the particulate carrier may be suspended in an organic solvent and the suspension added to the coating composition. The solvent used typically is an organic solvent compatible with the liquid coating composition.

It is also desirable that the organic solvent solvate or condition the substrate over which the catalytic coating composition is coated in order to promote bonding or adhesion of the coating of the catalyst to the substrate. Solvation of the substrate, as is known in the art, means softening the substrate without dissolving the same. This permits penetration of the substrate by the coating medium.

Solvating solvents for ABS are shown in U.S. Pat. No. 3,445,350 incorporated herein by reference. Solvating solvents for other polymers are disclosed in U.S. Pat. No. 3,754,070, also incorporated herein by reference. To solvate the substrate, it is preferred that a polar solvent be used, more preferably an oxygenated solvent such as an alcohol, ether or ether acetate. Suitable solvents include isopropyl alcohol, ethanol, methanol, acetone, methyl ethyl ketone, ethyl acetate, the Cellosolve acetates such as butyl cellosolve acetate and propylene glycol alkyl ether acetate, butyl carbitol, etc. The combination of a specific solvent with a specific substrate would depend upon the solvency of the solvent for the substrate. Solvents used to formulate the electroless plating catalyst can also be used to dilute the same as necessary for use. A solvating solvent for the substrate may also be added to the plating catalyst when diluting the catalyst for use.

The concentration of components in the platable coating composition following dilution with solvent is not critical. The metal content of the composition as adsorbed on the particulate carrier (expressed as metal) is preferably in an amount of from about 0.5 to 100.0 grams per liter of solution, more preferably, in an amount of from about 2.0 to 50.0 grams per liter and most preferably, in a range of 5.0 to 20.0 grams per liter. The particulate carrier over which the hydrous oxide or chalcogenide is deposited is present in solution in an amount of from 1 to 50 times the weight of the metal portion of the chalcogenide and more preferably in an amount of from 2 to 15 times the weight of the metal.

A made up platable coating composition ready for use will contain the carrier particles coated with the chalcogenide or hydrous oxide, other dissolved solids conventionally found within a coating composition—i.e., resins, polymers, pigments, etc., all hereinafter collectively referred to as the "dried coating solids", and the solvent for the coating composition. In a preferred embodiment of the invention, the concentration of the dried coating solids by weight to the suspended particles in the made up platable coating composition varies from about 2 to 1 to 50 to 1 and more preferably, varies from about 1 to 1 to 25 to Nonconductive substrates capable of metal plating using the platable coating composition of the invention include polymers such as polyphenylene oxide, acrylonitrile-butadiene-styrene (ABS) copolymers, polystyrene, polycarbonate, epoxy resins, polyvinyl chloride, polyethylene, polypropylene, polyethylene oxide terephthalate, fluorine polymers such as polytetrafluoroethylene, and other natural and synthetic polymers and blends of the aforesaid. The substrate may also include non-metallic materials such as silicate and non-silicate glasses, for example, quartz, soda lime float or plate glass, borosilicate, lead borate, alumino-silicate, alumina ceramic and tin oxide.

Application of the platable coating composition is by use of standard methods and equipment. A substrate is pretreated using standard methods and the coating is preferably applied by spraying, although brushing or other means of selectively applying the coating are applicable. Surfaces that are not to be coated are masked prior to application of the coating.

Following application of a coating of platable coating composition, the mask is removed whereby the coating is over the substrate in a selective pattern. If the particles are coated with the hydrous oxide, at this point in the process, the part may be treated with a solution of a chalcogenide to convert the hydrous oxide to the chalcogenide. An alkali metal solution containing from about 0.1 to 10 percent by weight of dissolved chalcogenide salt would be satisfactory. A preferred treatment solution would comprise sodium sulfide in water.

Preferably, the coating is dried prior to electrolytic deposition. Using the coating of the present invention, a recommended period of air drying is from 15 to 20 minutes followed by oven drying at a temperature not exceeding 100° C. for a period of time less than 60 minutes. This cures the coating and promotes adhesion of the coating to the substrate thus improving the adhesion between a subsequently applied metal deposit and the substrate. During drying, solvents present in the coating of the plating catalyst act to solvate the substrate and create a stronger bond between the substrate and the coating. Entrapped particles microscopically protrude from the surface and provide conductive sites for subsequent electrolytic deposition.

Electrolytic deposition is accomplished using prior art processes for plating chalcogenides and prior art plating solutions. Examples of such processes and solutions are disclosed in U.S. Pat. Nos. 3,685,661; 4,810,333; 4,895,739; and 4,919,768, all incorporated herein by reference. Many other electrolytic plating solutions known to those skilled in the art would also be suitable for purposes of the subject invention.

For EMI shielding, a dual layer of copper followed by nickel is preferred. Such a dual layer is disclosed in the above referenced U.S. Pat. No. 4,514,486. Using the process of this invention, including masking means to obtain selectivity, EMI shields are obtained in a selective pattern whereby the aesthetic features of a molded housing, for example, are preserved, while an effective EMI shield is provided.

The invention will be better understood by reference to the examples which follow. These examples are not intended to limit the scope of the invention.

EXAMPLE 11

This example represents one preferred embodiment of the invention.

A platable coating composition with particles having an adsorbed sulfide of silver has the following composition:

| | |
|---|---|
| Silver Sulfide (1) | 8.00 gm |
| Isopropyl Alcohol | 35.00 gm |
| Acetone | 23.00 gm |
| Ethyl Acetate | 40.00 gm |
| Silica Type OK 412 | 19.00 gm |
| Varnish (LS123) (2) | 346.00 ml |

(1) Prepared using the hydrous oxide of Example 5 followed by admixture of the solution with the silica and with a 0.1 molar sodium sulfide solution and removal by filtration and washing.
(2) L123 Polycarbonate Varnish from Bee Chemicals.

The silica particles coated with the silver sulfide may be added to the solvents with stirring. Thereafter, the varnish is added with stirring and ultrasonic agitation to disperse any agglomerates formed.

EXAMPLE 12

Example 11 may be repeated using a hydrous oxide of silver in place of silver sulfide. In this embodiment of the invention, following coating of the coating composition on to a surface and drying of the same, the coating would be treated with a 1 percent by weight solution of sodium sulfide to convert the silver hydrous oxide to a silver sulfide.

EXAMPLE 13

The formulation of Example 11 may be made with nickel sulfide increasing the concentration of the nickel sulfide to 15 grams.

EXAMPLE 14

A portion of a polycarbonate housing is masked and prepared for plating. The formulation of Example 11 is diluted with 50 ml of a composite thinner (54 volume percent acetone, 22 percent isopropyl alcohol and 24 percent ethyl acetate) and sprayed onto the polycarbonate substrate. The coating is applied at a wet thickness of about 3 mils at 25 psi air pressure. Following spraying, the coated part is allowed to air dry for about 1 hour and then placed in a hot air convection ove and dried at 100° C. for 10 minutes to provide a final dried coating which would be about 0.5 mils in thickness.

Following drying, the mask is removed and the substrate plated by electroplating copper from an acid copper electroplating bath identified as Electroposit ® 276 acid copper at a current density of 25 amps/sq. ft. and at a temperature of 75° F. for 30 minutes followed by a water rinse to provide a shiny copper deposit.

I claim:

1. A platable coating composition suitable for forming a conductive coating over a non conductive substrate, said composition comprising particles homogeneously dispersed in a liquid film forming coating composition comrpising a polymer dissolved in a solvent for the polymer, said particles comprising an inorganic inert particulate carrier coated with a conductive metal sulfide where the concentration of metal in the total weight of the particles in the coating composition varies from about 0.5 to 100 grams per liter of solution.

2. The composition of claim 1 where the particles comprise a sulfide of a metal selected from the group of copper, nickel, manganese, cobalt, iron, the noble metals and mixtures thereof adsorbed onto the inert particulate carrier.

3. The composition of claim 2 where the metal is silver.

4. The composition of claim 2 where the metal is nickel.

5. The composition of claim 1 where the liquid film forming coating composition is a varnish.

6. The composition of claim 1 where the liquid film forming coating composition contains a polymer selected from the group consisting of phenolics, epoxies, alkyds, polyesters, acrylics, polyurethanes and polyamides.

7. The composition of claim 1 where the concentration of the emtal varies from about 2.0 to 50.0 grams per liter of solution.

8. The composition of claim 1 where the concentration of the metal varies from about 5.0 to 20.0 grams per liter of solution.

9. The composition of claim 1 where the weight ratio of the particles to the solids content of the liquid film forming coating composition varies between 1:1 and 25:1.

10. The composition of claim 1 where the particulate carrier is an irregularly shaped particle selected from the group consisting of carbon, glass, titania or silica.

11. The composition of claim 10 where the particulate carrier is silica.

12. The composition of claim 1 where the particle size of the particulate carrier ranges between 1 and 100 microns.

13. A platable coating composition suitable for forming a conductive coating over a non conductive substrate, said composition comprising nickel sulfide adsorbed onto an inorganic inert particulate carrier homogeneously dispersed in an organic solution of a liquid film forming polymer coating composition, said composition having a total nickel concentration of from 2.0 to 50 grams per liter of solution with the particulate carrier present in an amount of from 1 to 50 times the weight of the nickel.

14. The composition of claim 13 where the concentration of nickel varies from about 5.0 to 20.0 grams per liter of solution.

15. The composition of claim 13 where the liquid film forming coating composition contains a polymer selected from the group consisting of phenolics, epoxies, alkyds, polyesters, acrylics, polyurethanes and polyamides.

16. The composition of claim 13 where the particulate carrier is present in the catalytic coating composition in an amount of from 1 to 50 times the weight of nickel.

17. The composition of claim 16 where the particulate carrier is present in the coating composition in an amount of form 2 to 15 times the weight of the nickel.

18. The composition of claim 13 where the weight ratio of the particles to the solids content of the liquid film forming coating composition varies between 1:1 and 50:1.

19. The composition of claim 13 where the weight ratio of the particles to the solids content of the liquid film forming coating composition varies between 2:1 and 25:1.

20. The composition of claim 19 where the particulate carrier is silica.

21. The composition of claim 13 where the particle size of the carrier particles range between 1 and 100 microns.

* * * * *